United States Patent [19]
Kim

[11] Patent Number: 5,926,380
[45] Date of Patent: Jul. 20, 1999

[54] LEAD FRAME LATTICE AND INTEGRATED PACKAGE FABRICATION METHOD APPLIED THERETO

[75] Inventor: Dong You Kim, Choongcheongbuk-Do, Rep. of Korea

[73] Assignee: LG Semicon Co., Ltd., Cheongju, Rep. of Korea

[21] Appl. No.: 08/851,955

[22] Filed: May 6, 1997

[30] Foreign Application Priority Data

May 17, 1996 [KR] Rep. of Korea ............. 96-16645

[51] Int. Cl.⁶ .................................................. H05K 03/30
[52] U.S. Cl. ................. 361/813; 361/820; 361/772; 361/723; 361/717; 257/666; 257/672; 257/618; 257/622; 257/676; 257/690; 257/692; 257/734
[58] Field of Search ............................ 361/813, 820, 361/772, 723, 717; 257/618, 622, 693, 666, 670, 690, 692, 734, 735, 672, 676, 784, 750

[56] References Cited

U.S. PATENT DOCUMENTS

| | | | |
|---|---|---|---|
| 5,363,279 | 11/1994 | Cha | 361/767 |
| 5,554,886 | 9/1996 | Song | 257/666 |
| 5,656,553 | 8/1997 | Leas et al. | 438/15 |
| 5,657,206 | 8/1997 | Pedersen et al. | 361/772 |
| 5,668,400 | 9/1997 | Quinn | 257/618 |
| 5,685,885 | 11/1997 | Khandros et al. | 29/841 |

*Primary Examiner*—Leo P. Picard
*Assistant Examiner*—David Foster
*Attorney, Agent, or Firm*—Fleshner & Kim

[57] ABSTRACT

A lattice of a plurality of individual lead frames allows concurrent or simultaneous molding of a plurality of integrated chips formed in a wafer. The lattice includes a plurality of lead supporting bars arranged in rows and columns and a plurality of leads attached to corresponding ones of the plurality of supporting bars. The plurality of lead supporting bars align with chip partition lines defining each individual integrated chip formed in the wafer. During fabrication, a plurality of individual lead frames is correspondingly attached to a plurality of individual integrated chips formed in a wafer. A plurality of wires are bonded between the plurality of chip pads and the plurality of leads. The wafer is molded such that the plurality of individual lead frames, the plurality of wires, the first surface of the plurality of individual integrated chips and the plurality of chip pads are molded with an epoxy compound with portions of the plurality of leads exposed. The wafer is cut along chip partition lines defining each individual chip to form a plurality of individual chip packages.

17 Claims, 7 Drawing Sheets

LEAD FRAME LATTICE AND INTEGRATED PACKAGE FABRICATION METHOD APPLIED THERETO

BACKGROUND OF THE INVENTION

1. Field of the Invention

The present invention relates to a package and a method thereof, and more particularly, to a lead frame lattice, a semiconductor package and a method thereof.

2. Background of the Related Art

As semiconductor package components are increasingly minimized in size, the size of a semiconductor package needs to be smaller and thinner for mass production. FIG. 1 illustrates a LOC (lead on chip) type semiconductor package. A paddle 1 is mounted on a semiconductor chip 2 on which, except at the center thereof, an adhesive cover film 4 is formed over a plurality of leads 3. Each lead has multiple bends. On the center of the surface of the chip 2, there are formed a plurality of chip pads 5, each of which is electrically connected by a metallic wire 6 to a corresponding one of the leads 3. An epoxy compound 7 is molded on the chip 2 including the leads 3, the adhesive film 4, the chip pads 5, and the metallic wires 6. The upper surface of a portion of each of the leads 3 is exposed externally.

With reference to FIGS. 2A through 2E, the fabrication method of the above chip-size semiconductor package will now be described. First, as shown in FIG. 2A, there is performed a die bonding process for mounting the semiconductor chip 2 on the paddle 1 extending from a die pad frame 8. As shown in FIG. 2B the die pad frame 8, which includes the chip 2 thereon is aligned with the lead frame 9 and fitted to the central padding. A welding process is performed to connect the die pad frame 8 to the lead frame 9.

As shown in FIG. 2B, a wire bonding process is performed with the metallic wires 6 to electrically connect each of the chip pads 5 formed on the central surface of the chip 2 to a corresponding one of the leads 3. As shown in FIG. 2C, the chip 2, connected by welding to each of the frames 8, 9, is aligned in a cavity 13 formed in the surface of a lower mold 12. Next, an upper mold 11 is attached to the lower mold 12 and a molding compound 7 is injected into a vent hole 12a.

As shown in FIG. 2D, the molds 11, 12 are detached from the frames 8, 9 after completing the molding process. A trimming process follows to cut off the externally projected portions from the molded package body 7, thereby completing the chip-size semiconductor package having externally exposed leads 3 from the bottom surface of the package body 7.

To fabricate the above semiconductor package, the semiconductor chip 2 is individually detached from a wafer prior to performing the die bonding. The detached chip 2 is sealingly aligned on the paddle 1 of the die pad frame 8 so as to proceed with the wire bonding process. However, the individual attachment of the chip to the paddle requires increased time due to the redundant and complicated fabrication steps. Also, the complicated steps may cause an external damage to the chip to thereby restrain its yield.

The above references are incorporated by reference herein where appropriate for appropriate teachings of additional or alternative details, features and/or technical background.

SUMMARY OF THE INVENTION

It is an object of the present invention to solve the problems of the related art.

It is an object of the present invention to provide an integrated chip.

It is an object of the present invention to provide an integrated chip package fabrication method to enhance the yield by simplifying the fabrication steps.

It is another object to provide a novel lead frame lattice for fabricating the integrated package in accordance with the present invention.

To achieve the above-described objects, a lead frame of a semiconductor chip package includes a plurality of lead-supporting bars each of which corresponds to a corresponding chip partitioning line on a wafer, and a plurality of leads extending facing each other from each lead bar toward a vertical center line of each of the chips.

The above objects, advantages and features may be achieved in whole or in part by a method of making a plurality of individual chip packages comprising the steps of: (a) correspondingly attaching a plurality of individual lead frames to a plurality of individual integrated chips formed in a wafer, each individual lead frame having a plurality of leads with first and second surfaces, and each individual chip having first and second surfaces and a plurality of chip pads formed on the first surface; (b) bonding a plurality of wires between the plurality of chip pads and the plurality of leads; (c) molding the wafer such that the plurality of individual lead frames, the plurality of wires, the first surface of the plurality of individual integrated chips and the plurality of chip pads are molded with an epoxy compound, wherein portions of the plurality of leads are exposed; and (d) cutting the wafer to form the plurality of individual chip packages.

The present invention may also be achieved in whole or in part by a lattice of a plurality of individual lead frames for concurrently molding a plurality of integrated chips formed in a wafer, comprising: a plurality of lead supporting bars arranged in rows and columns; and a plurality of leads attached to corresponding ones of the plurality of supporting bars, wherein the plurality of lead supporting bars align with chip partition lines defining each individual integrated chip formed in the wafer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
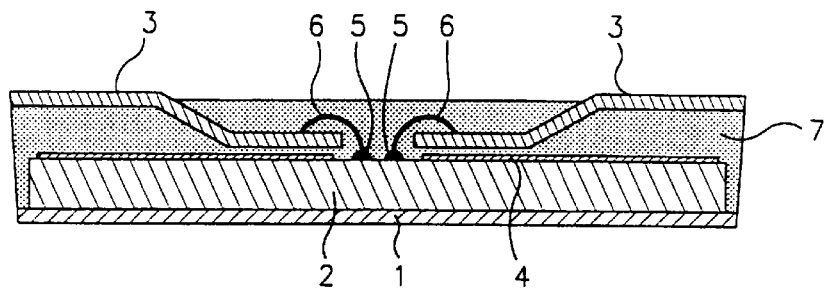
FIG. 1 is a cross-sectional view of a semiconductor package of the related art.
Figure 2A:
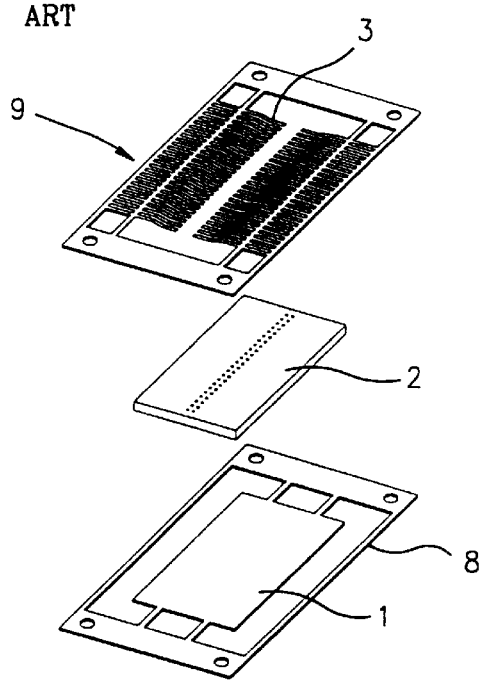
FIG. 2A is an exploded perspective view of the package of FIG. 1 for describing a die bonding and a frame welding thereof.
Figure 2B:
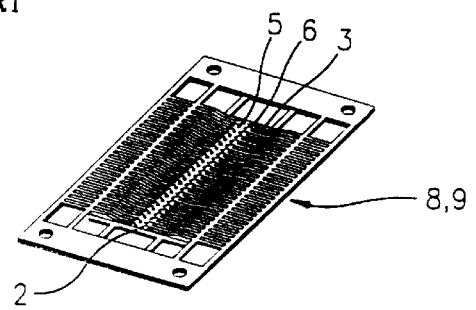
FIG. 2B is a perspective view of the assembled package of FIG. 2A for showing a wire bonding step.
Figure 2C:
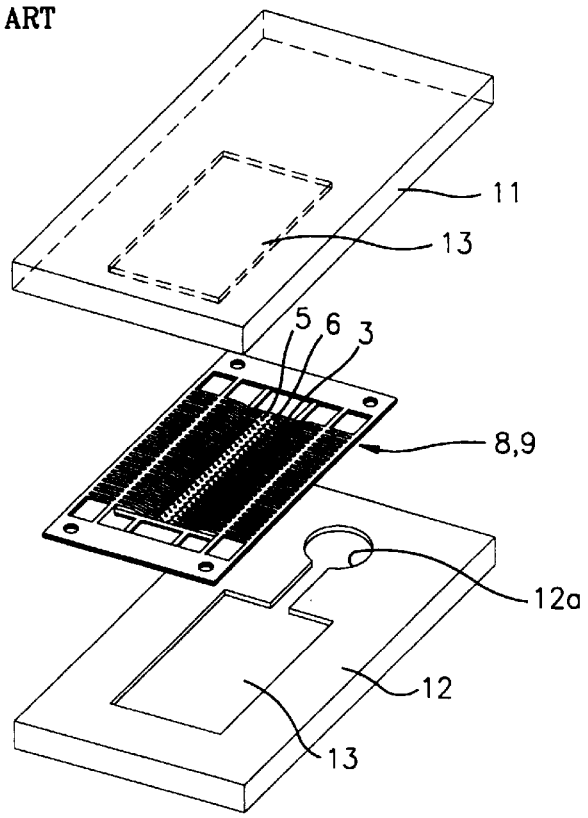
FIG. 2C is a perspective view of the chip-size semiconductor package fabrication process for showing a compound molding step.
Figure 2D:
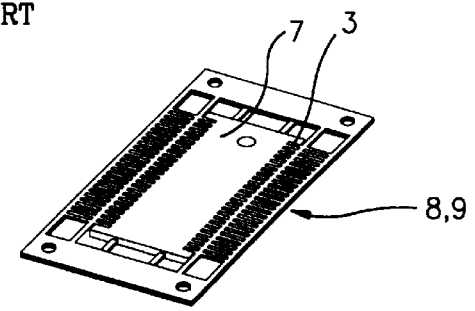
FIG. 2D is a perspective view of the completed semiconductor package.
Figure 2E:
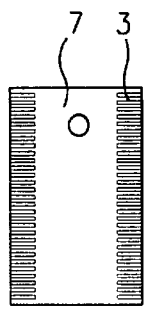
FIG. 2E is a bottom view of the completed semiconductor package.
Figure 3:
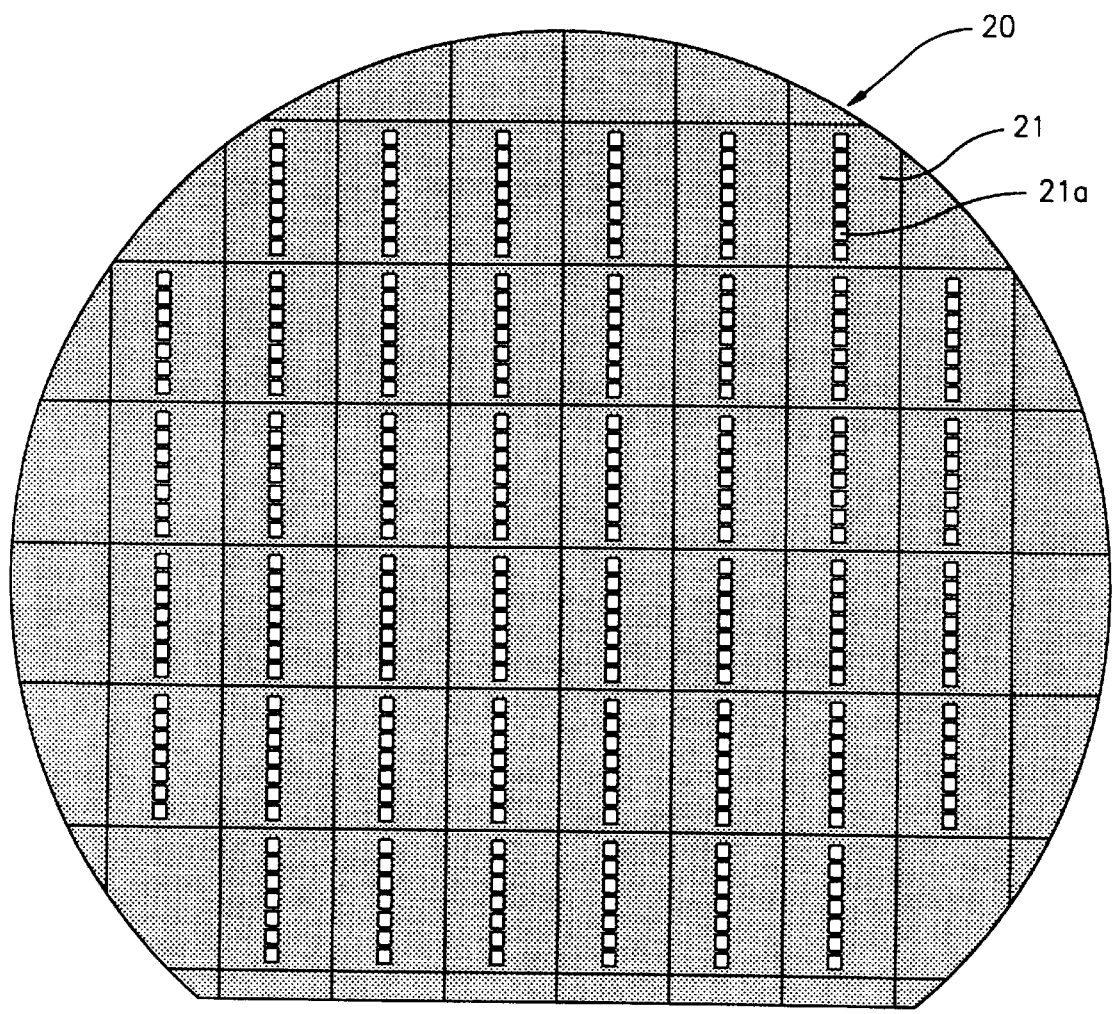
FIG. 3 is a plan view of a semiconductor wafer with a plurality of center pads on each chip area thereof.

As shown in FIG. 3, a wafer 20 is partitioned and latticed into a plurality of individual dies or chips 21, each of which can be later detached therefrom. On the center of each of the chips 21, a plurality of center pads 21a are centrally aligned.

Figure 4:
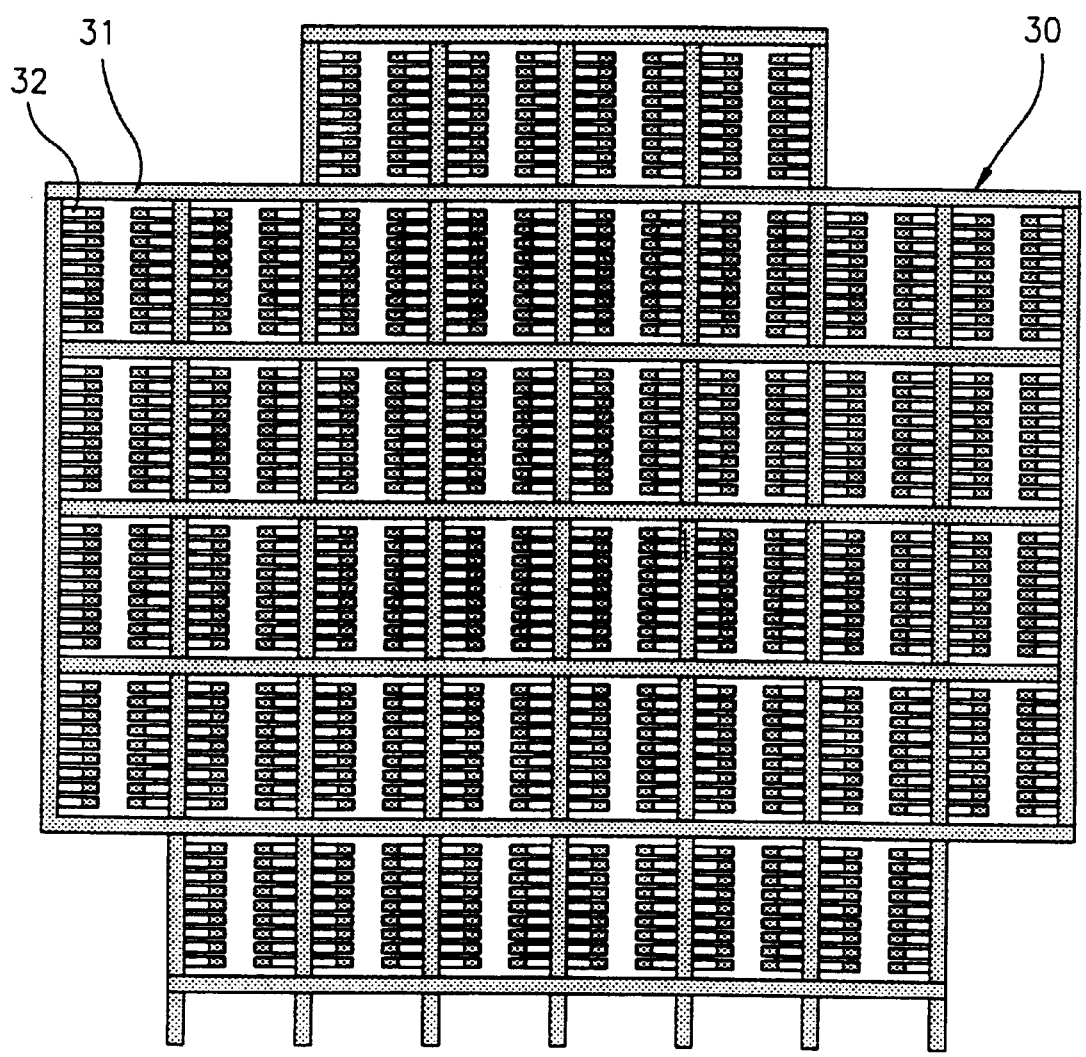
FIG. 4 is a plan view of a plurality of individual lead frames in accordance with the present invention.

Referring to FIG. 4, a lattice of a plurality of lead frames 30 includes a plurality of lead supporting bars 31 arranged in columns and rows for supporting a plurality of leads 32. The lead supporting bars 31 are respectively provided to correspond with chip partition lines defining each chip in the wafer 20 of FIG. 3.

Inside each of the lattices surrounded by the lead supporting bars 31, the leads 32 respectively extend from each of the column lead supporting bars 31 to a prescribed distance toward a central vertical line of each of the lattices to thereby facilitate packaging a center-pad type semiconductor chip. Each of the leads 32 has at least one inclined suface, e.g., a bend or a step therein, and the width of each of the lead supporting bars 31 is desirably less than the thickness of the wafer 21. In the figures, the width is exaggerated for illustration purposes.

Figure 5A:
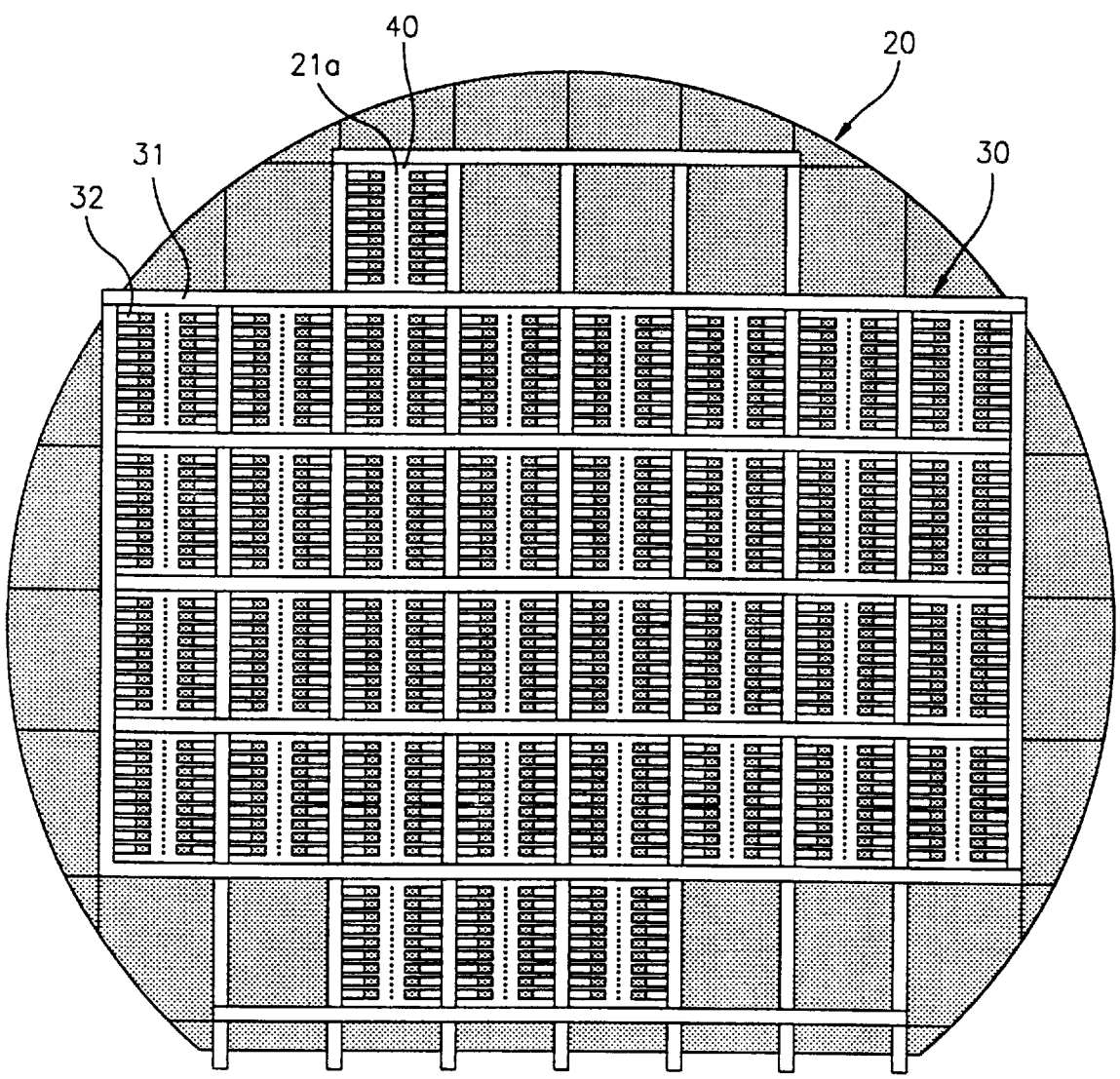
FIG. 5A is a plan view of a plurality of individual lead frames of the present invention mounted on a semiconductor wafer.

The chip-size semiconductor package fabrication method in an accordance with the present invention will now be described. As shown in FIG. 5A, the lattice of lead frames 30 of FIG. 4 is mounted on the wafer 20 of FIG. 3, so as to align the lead supporting bars 31 to the corresponding ones of the chip partitioning lines of FIG. 3. Thereafter, the frame 30 and wafer 20 are sealingly attached to each other by an adhesive cover film 40, whereby the plurality of leads 32 extending over each of the chips 21 are aligned on each side of the center pads 21a, which are lined up on the center of each of the chips 21.

Figure 5B:
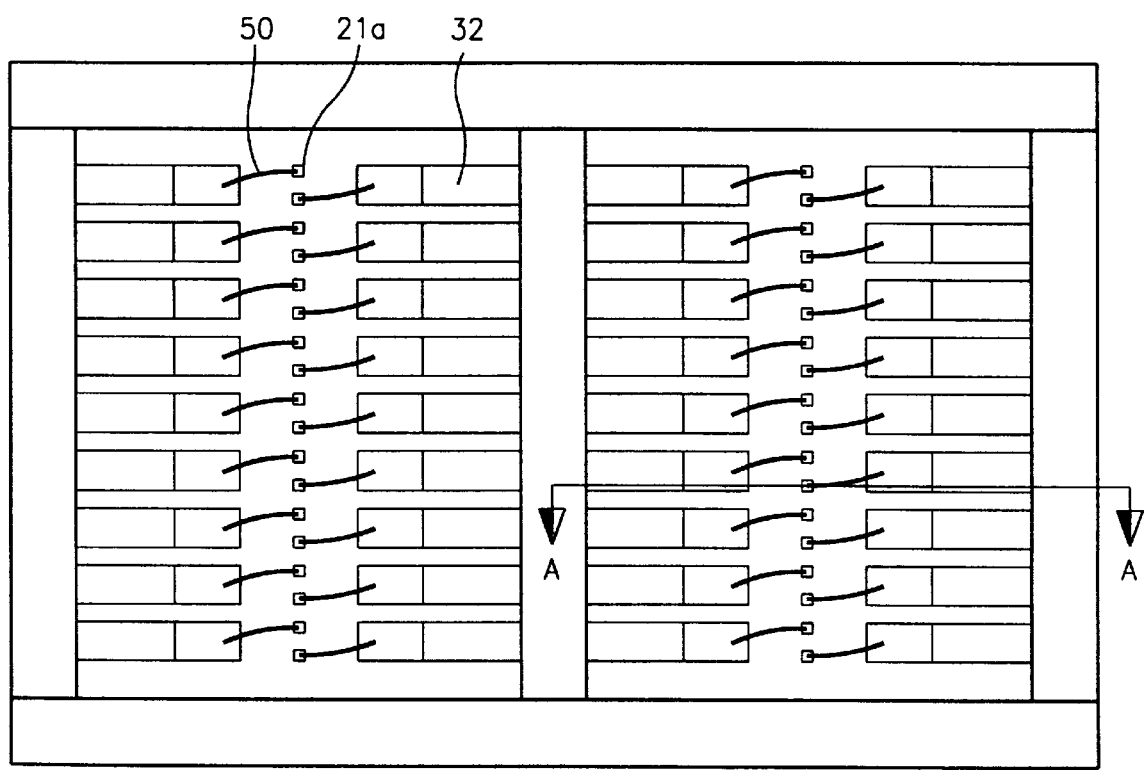
FIG. 5B is a plan view showing a wire bonding process in accordance with present invention.
Figure 5C:
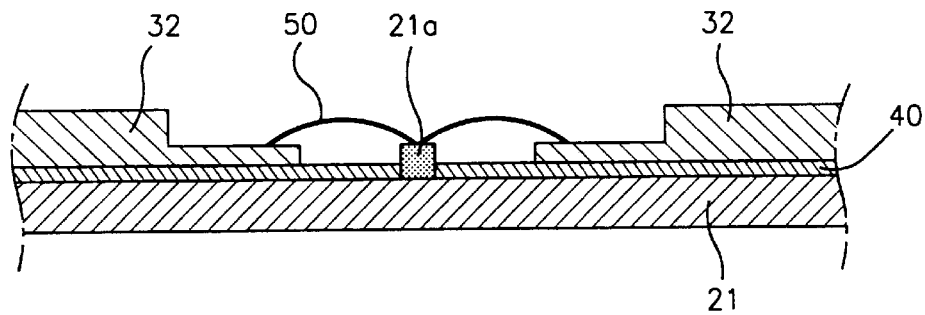
FIG. 5C is a cross-sectional view taken along line 5C—5C in FIG. 5B.

As shown in FIG. 5C, each of the plurality of leads 32 includes first, second and third portions, wherein the second portion connects the first and third portions. Each of the portions has first and second surfaces. The first surface of the first and third portions are non-planer, e.g., they are at different heights. The second surface of the first, second and third portions are substantially co-planar, and are attached to the chip 21 by the adhesive film 40.

Figure 5D:
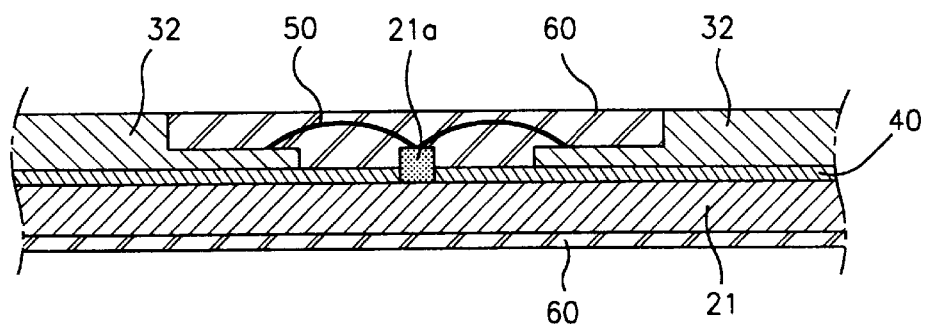
FIG. 5D is a cross-sectional view of a chip package according to the present invention for showing a molding process.

Then, as shown in FIGS. 5B and 5C, a wire bonding process is performed using metallic wires 50 to electrically connect each of the leads 32 to a corresponding one of the center pads 21a. Thereafter, as shown in FIG. 5D, a molding process is performed using an epoxy molding compound 60 to seal each of the semiconductor packages including the metallic wires 50, the center pads 21a and the leads 32 but externally exposing the uppermost surface of each of the leads 32.

Figure 5E:
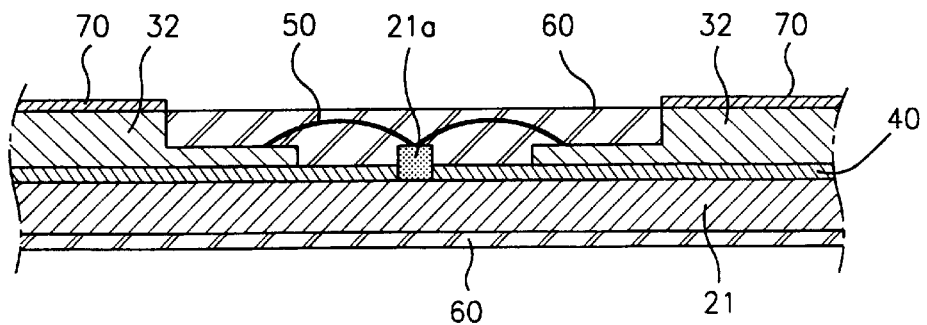
FIG. 5E is a cross-sectional view of a chip package according to the present invention for showing a plating process.

As shown in FIG. 5E, a plating process is performed using a conductive metallic material 70 on each of the externally exposed leads 32, wherein the conductive metallic material 70, is desirably a solder, to apply an electroplating thereto. Finally, a cutting process, e.g., sawing process, is performed along each of the lead supporting bars 31 of the lead frame 30 so as to form individual semiconductor chips, thereby completing thee chip-size semiconductor chip packages in accordance with the present invention. At this time, because the width of each of the lead supporting bars 31 is less than the thickness of the sliced wafer 20, each of the lead supporting bars is completely eliminated during the cutting process.

As described above, in the chip-size semiconductor package fabrication method according to the present invention, the lead frame lattice is sealingly mounted on the wafer, accompanied by the wire bonding and the compound molding steps and finally detaching the individual chips from each other, thereby reducing the necessary fabrication steps and accordingly facilitating the mass production thereof. The present invention allows simultaneous or concurrent fabrication of a plurality of individual chip packages to improve the yield, reduce cost and make mass production easier.

The foregoing embodiment is merely exemplary and is not to be construed as limiting the present invention. The present scheme may be readily applied to other types of packages In the foregoing embodiments, the surfaces were referred to as upper and lower surfaces or top and bottom surfaces for convenience to illustrate the present invention in view of the figures. As can be appreciated, the surface reference is dependent upon the orientation of the package. Further, the arrangement of the lattice were indicated as rows and columns or vertical, but such terminology is based on the x, y and z orientation or direction. Moreover, the present invention is applicable for packaging various integrated chips, and various conductive materials can be use for conductive coupling, including metal and solder. The description of the present invention is intended to be illustrative, and not limiting the scope of the claims. Many alternatives, modifications and variations will be apparent to those skilled in the art.

What is claimed is:

1. A lead frame for using in forming a semiconductor chip package, comprising:

a plurality of lead supporting bars each of which accords with a corresponding chip partitioning line on a wafer; and a plurality of leads extending from columnar ones of the lead supporting bars and approaching a vertical center line therebetween.

2. The lead frame of claim 1, wherein the plurality of lead supporting bars form a rectangular lattice.

3. The lead frame of claim 1, wherein each of the leads has at least one step formed therein.

4. The lead frame of claim 1, wherein each of the leads has at least one bend formed therein.

5. The lead frame of claim 1, wherein a width of each of the lead supporting bars is less than a thickness of a wafer to which the lead frame will be attached.

6. A lattice of a plurality of individual lead frames for concurrently molding a plurality of integrated chips formed in a wafer, comprising:

a plurality of lead supporting bars arranged in rows and columns; and a plurality of leads attached to corresponding ones of said plurality of supporting bars, wherein said plurality of lead supporting bars align with chip partition lines defining individual integrated chips formed in the wafer.

7. The lattice of claim 6, wherein each of said plurality of leads includes first and second and third portions, said second portion connecting said first and third portions, each portion having first and second surfaces, the second surface of said first, second and third portions being substantially co-planar for attachment to a corresponding integrated chip.

8. The lattice of claim 7, wherein the first surface of said first and third surfaces are non-planar and the first surface of said second portion is inclined.

9. The lattice of claim 6, wherein said plurality of leads extend from corresponding supporting bars toward a center of each individual lead frame.

10. The lattice of claim 9, wherein a column opening is formed in each individual lead frame.

11. The lattice of claim 6, wherein a width of each of said plurality of lead supporting bars is less than a thickness of a wafer to which the lead frame will be attached.

12. An integrated chip package, comprising:

an integrated chip having first and second surfaces and a plurality of chip pads formed on the first surface;

a plurality of leads, each having first, second and third portions, said second portion connecting said first and third portions, each portion having first and second surfaces, the second surface of said first, second and third portions being substantially co-planar for attachment to the first surface of said integrated chip;

a plurality of wires coupled to said plurality of leads and chip pads; and an epoxy compound -which molds said plurality of wires, said plurality of chip pads and the first surface of said integrated chip and said first portion of said plurality of leads, wherein the first surface of said third portion of said plurality of leads are exposed.

13. The integrated chip package of claim 12, wherein the first surface of said first and third portions are non-planar and the first surface of said second portion is inclined.

14. The integrated chip package of claim 13, wherein the first surface of said second portion is perpendicular to the first surface of said integrated chip package.

15. The integrated chip package of claim 12, wherein said plurality of chip pads are substantially aligned on a centerline of the first surface of the integrated chip.

16. The integrated chip package of claim 12, wherein a conductive material is formed on the exposed first surface of said third portions of said plurality of leads.

17. The integrated chip package of claim 16 further comprising an adhesive cover film that attaches the second surface of said first, second and third portions to the first surface of said integrated chip.

* * * * *